US006737703B1

United States Patent
Fastow et al.

(10) Patent No.: US 6,737,703 B1
(45) Date of Patent: May 18, 2004

(54) MEMORY ARRAY WITH BURIED BIT LINES

(75) Inventors: Richard Fastow, Cupertino, CA (US); Sameer Haddad, San Jose, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 254 days.

(21) Appl. No.: 10/095,512

(22) Filed: Mar. 12, 2002

(51) Int. Cl.[7] .................. H01L 21/8247; H01L 29/788
(52) U.S. Cl. ..................... 257/316; 257/321; 438/262
(58) Field of Search ............................ 287/316–323; 438/257–267

(56) References Cited

U.S. PATENT DOCUMENTS 5,656,513 A * 8/1997 Wang et al. ................ 438/262
6,413,843 B1 * 7/2002 Hara .......................... 438/525

* cited by examiner

*Primary Examiner*—Richard A. Booth (57) ABSTRACT

In a memory device, a substrate has a plurality of source/drain regions in the substrate. Between the source/drain regions are trenches filled with oxide. Individual bit lines in the form of conductive regions are provided in the substrate, each bit line being under and running along the oxide in a trench. Each bit line connects to source/drain regions by means of connecting conductive regions extending from that bit line to source/drain regions.

13 Claims, 7 Drawing Sheets

MEMORY ARRAY WITH BURIED BIT LINES

BACKGROUND OF THE INVENTION

1. Technical Field

This invention relates generally to memory devices, and more particularly, to the configuration of a flash memory array.

2. Background Art

Figure 1:
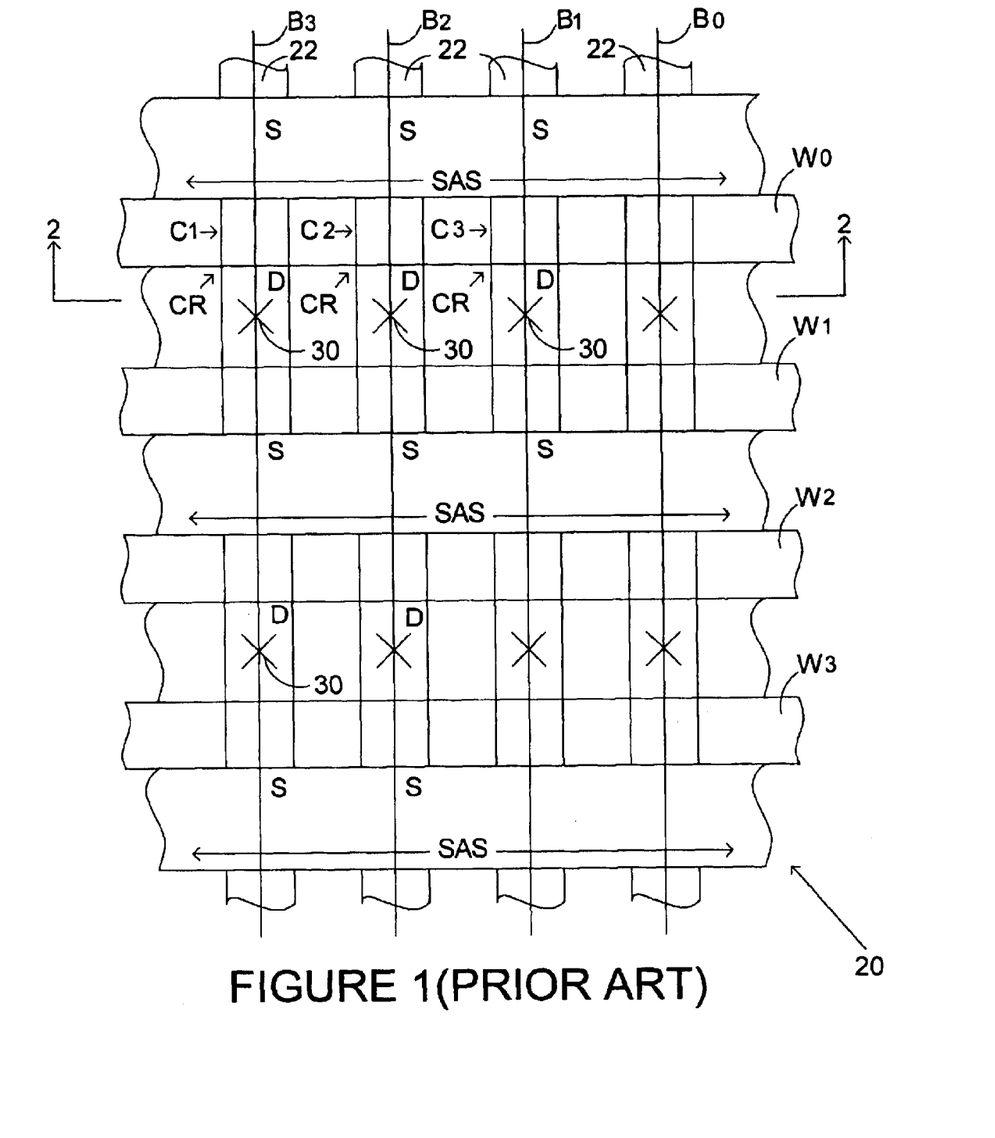
FIG. 1 is a plan view of a layout of a typical prior art NOR memory array.

FIG. 1 illustrates a typical NOR memory array structure 20 in layout form. The layout structure 20 includes elongated, substantially parallel source/drain regions 22, each made up of alternating sources S and drains D, a channel region CR connecting each adjacent source S and drain D as shown. Each bit line B0, B1, B2, B3 is associated with a respective source/drain region 22 running therealong and contacting individual drains D of its associated source/drain region 22 by means of contacts 30. The word lines of the structure are shown at W0, W1, W2, W3, and are orthogonal with a bit lines B0, B1, B2, B3. The sources S of the source/drain regions 22 are connected together in a direction parallel to the word lines W0, W1, W2, W3 as shown in FIG. 1, being formed by a self-aligned-source (SAS) process as for example disclosed in U.S. Pat. No. 5,656,513, Nonvolatile Memory Cell Formed Using Self Aligned Source Implant, issued to Wang et al. on Aug. 12, 1997, herein incorporated by reference. Cells C1, C2, C3 . . . are formed at the intersections of word lines W0, W1, W2, W3 and bit lines B0, B1, B2, B3.

Figure 2:
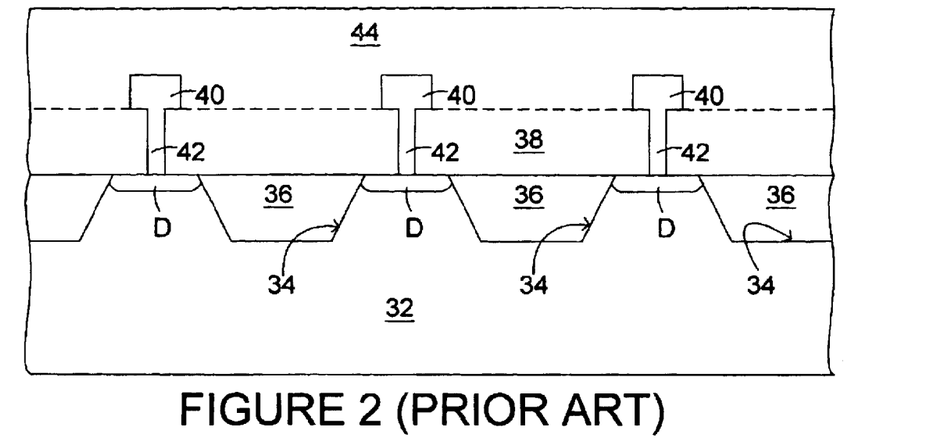
FIG. 2 is a sectional view along the line 2—2 of FIG. 1.

FIG. 2 is a sectional view of FIG. 1. As shown therein, a substrate 32 has a plurality of elongated, parallel trenches 34 formed therein, each trench 34 being filled with oxide 36. A dielectric layer 38 is disposed thereover, and metal bit lines 40 are formed above the dielectric layer 38 and connected to respective drains D by vias 42. Provided over this structure is another dielectric layer 44, on which additional elements of the array are provided.

It will be noted that the fabrication of the bit lines of the array of FIGS. 1 and 2 requires formation of individual vias 42 in thee dielectric layer 38 to contact the drains D as described above, followed by formation of individual bit lines in trenches in the dielectric layer 38 to contact the vias 42 so that contact is made between the bit lines B0, B1, B2, B3 and drains D. While this is a well-known approach, it will be understood that increased efficiency and simplicity of design and fabrication are desirable.

Therefore, what is needed is a memory array wherein improved design and fabrication are achieved.

DISCLOSURE OF THE INVENTION

The present invention is a memory device having a substrate, and a plurality of source/drain regions in the substrate, each comprising a plurality of alternating sources and drains. The substrate defines a plurality of trenches filled with oxide, each positioned between an adjacent pair of source/drain regions, so that each oxide region has respective source/drain regions on one and the other sides thereof. Further included are a plurality of word lines and a plurality of bit lines, each bit line comprising a conductive region in the substrate, with oxide in a trench overlying each bit line. Further included are a plurality of connecting conductive regions in the substrate and associated with each bit line, each bit line being connected to (i) the sources of the source of the source/region on one side of the oxide overlying that bit line by some of the connecting conductive regions associated with that bit line, and (ii) the drains of a source/drain region on the other side of the oxide overlying that bit line by others of the connecting conductive regions associated with that bit line. The connecting conductive regions associated with each bit line extend therefrom to the source/drain regions on one and the other side of the oxide overlying that line in an alternating manner along the bit line length.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 3:
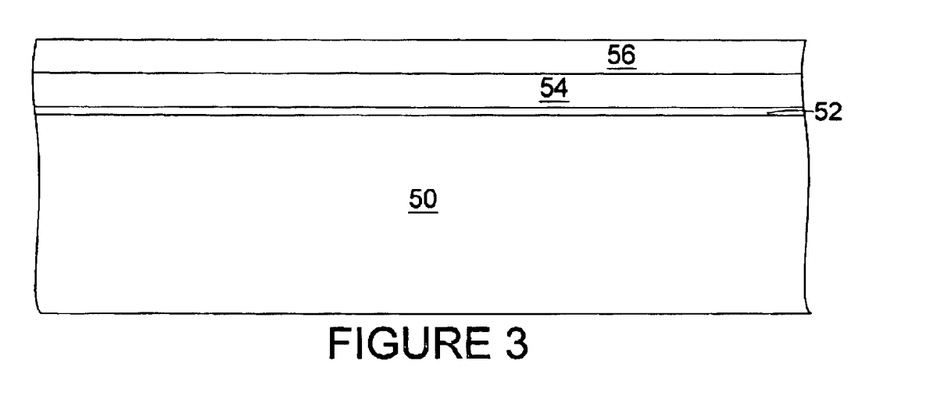
FIGS. 3–6 are sectional views illustrating steps in the method of fabricating the present device.
Figure 4:
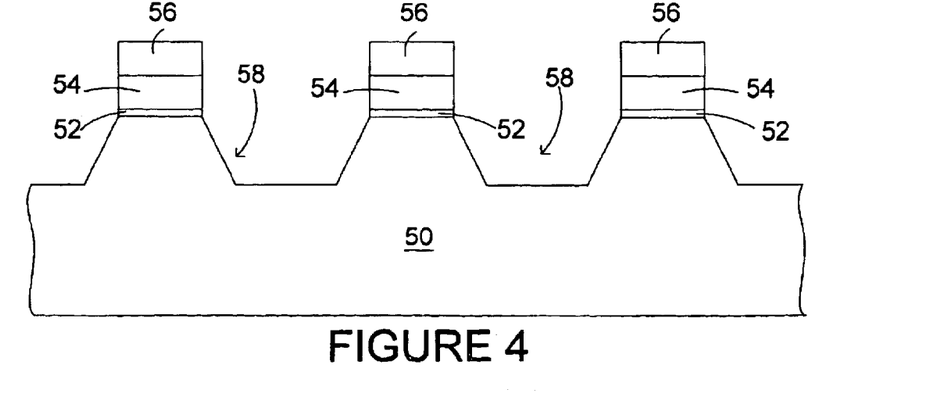

FIG. 3 shows a semiconductor substrate 50 having tunnel oxide layer 52 thereover, a polysilicon layer 54 on the oxide layer 52, and a hard mask layer 56 formed on the polysilicon layer 54. The hard mask layer 56 is patterned as shown in FIG. 4, and the remaining portions of the hard mask layer 56 are used as a mask for etching through the polysilicon layer 54 and oxide layer 52 and into the substrate 50 to form trenches 58.

Figure 5:
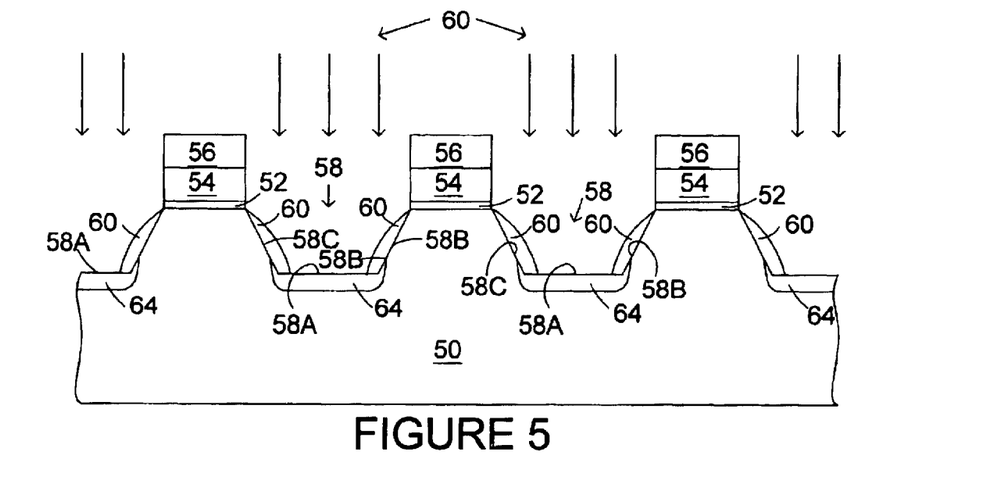
Figure 6:
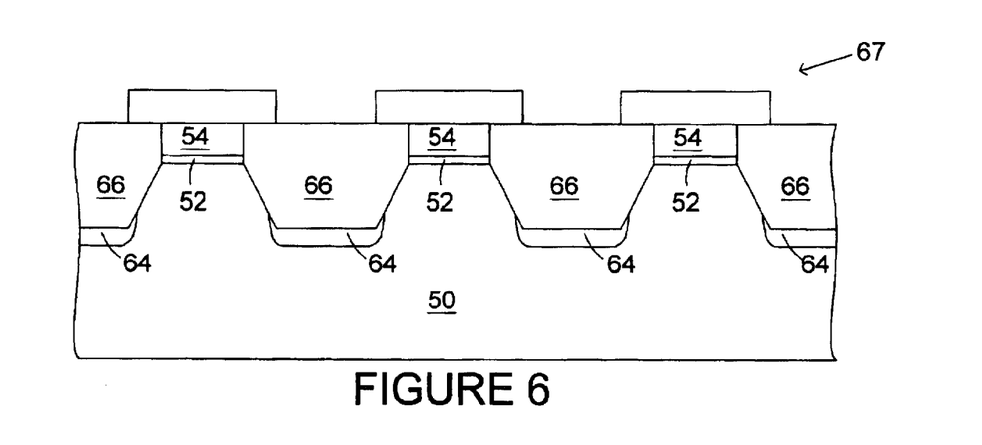

With reference to FIG. 5, after formation of oxide spacers 60 on the walls 58B, 58C of the trenches 58, an implantation step 60 is undertaken to form bit lines 64 made up of conductive regions, each running along a respective trench 58 at the base 58A thereof. The trenches 58 are then filled with oxide 66 (FIG. 6), which is provided up to the top surfaces of the remaining portions of the polysilicon layer 54. Then, another layer of polysilicon 67 is provided over the structure and is patterned as shown in FIG. 6. Thereafter, an ONO layer 68 and another polysilicon layer 70 are provided thereover (FIG. 7).

Figure 7:
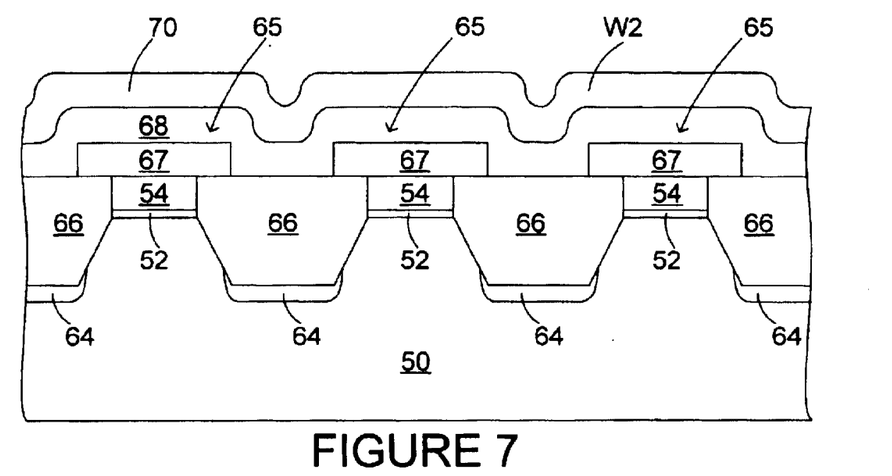
FIGS. 7, 8 and 9 are sectional views taken along the lies 7—7, 8—8 and 9—9 of FIG. 10.
Figure 9:
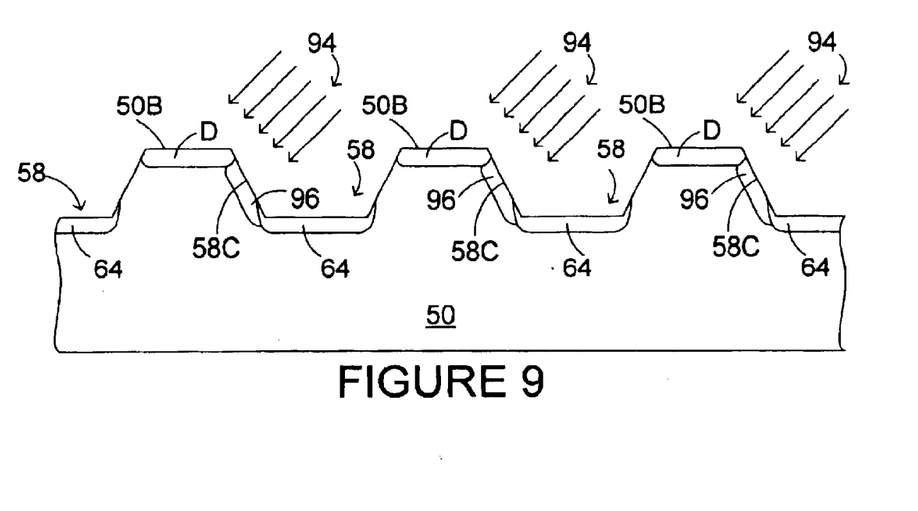
Figure 10:
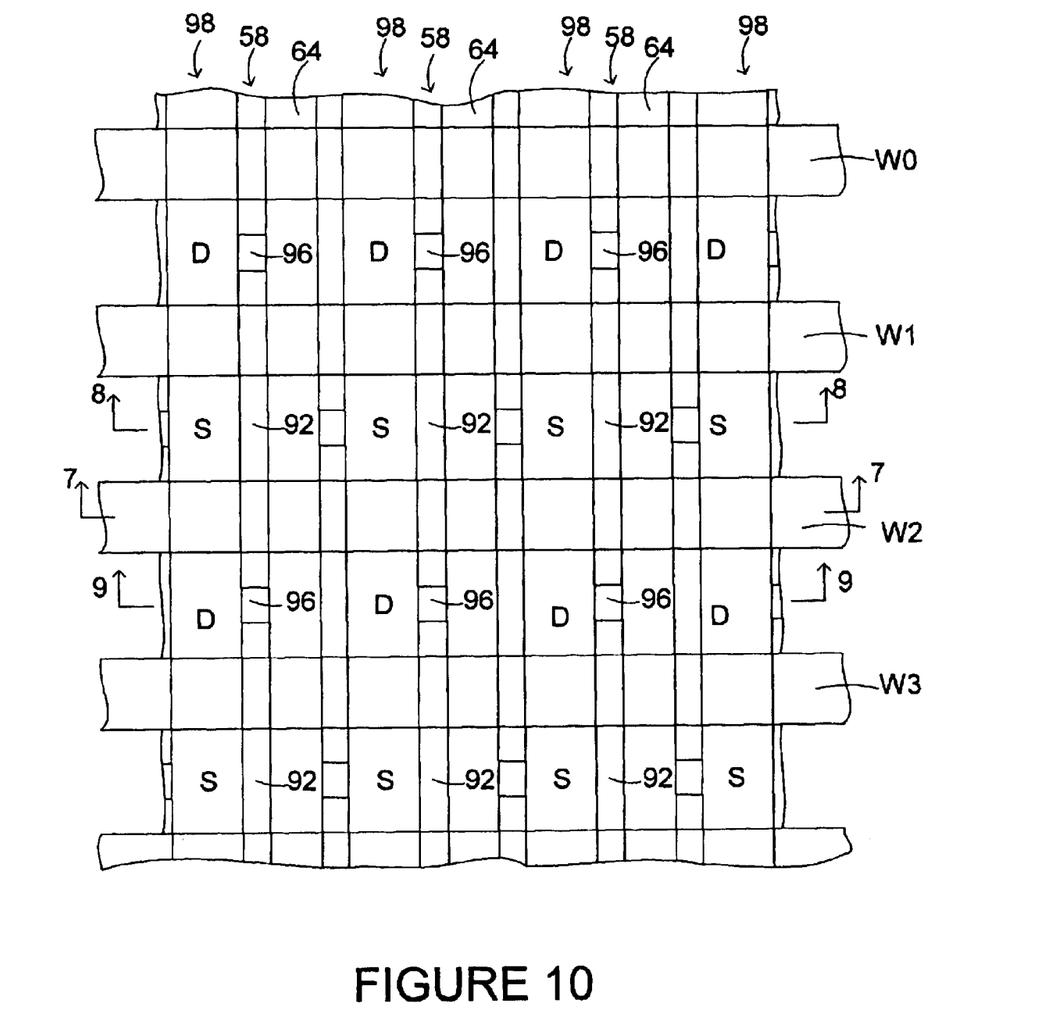
FIG. 10 is a plan view of a layout of the present memory device as partially fabricated.

FIG. 7 is a sectional view of a portion of the structure of FIG. 10 (showing the device further along in the process), taken through a floating gate structure and associated word line, this being one of a plurality of such structures therein. As shown, the structure of FIG. 7 includes gate oxides 52, floating gates 65 (each including a polysilicon layer portion 54 and a polysilicon layer portion 67), ONO layer 68, and word line 70. Using this structure as a mask, oxide is removed from between adjacent word lines. This results in oxide being removed from the trenches 58, and oxide 52 being removed from the silicon between the trenches 58 (FIG. 8 shows oxide removed from an area between word lines W1 and W2 of FIG. 10, while FIG. 9 shows oxide removed from an area between word lines W2 and W3 of FIG. 10).

Figure 8:
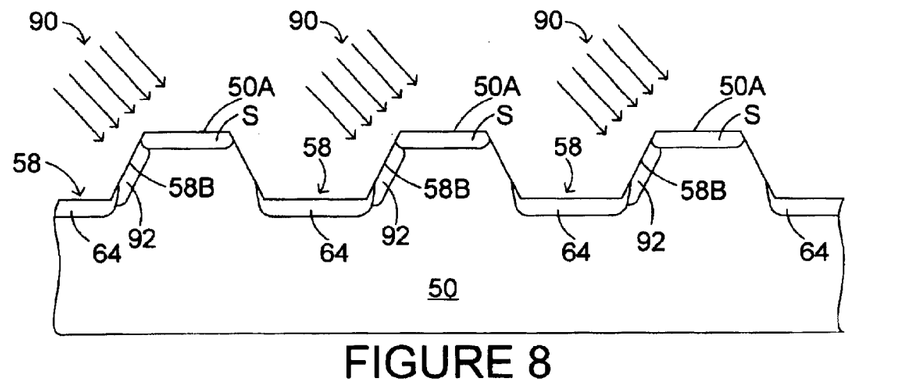
Figure 11:
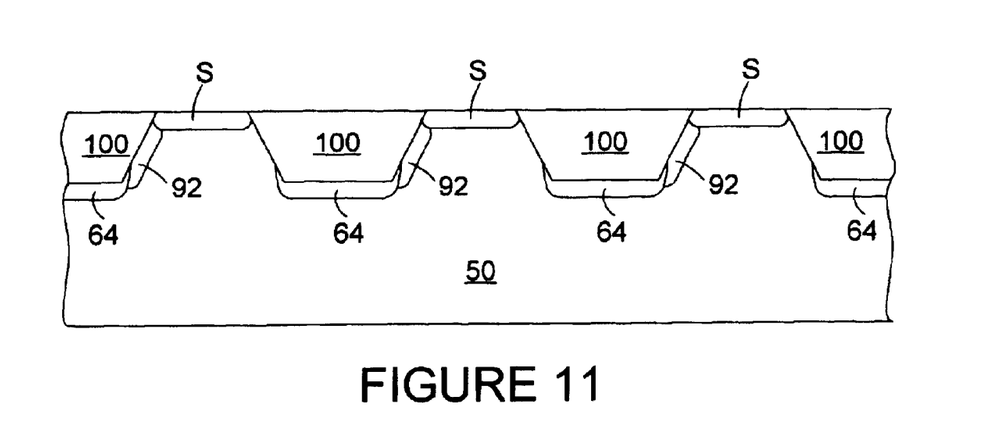
FIGS. 11 and 12 are sectional views illustrating further steps in the method of fabricating the present device.
Figure 12:
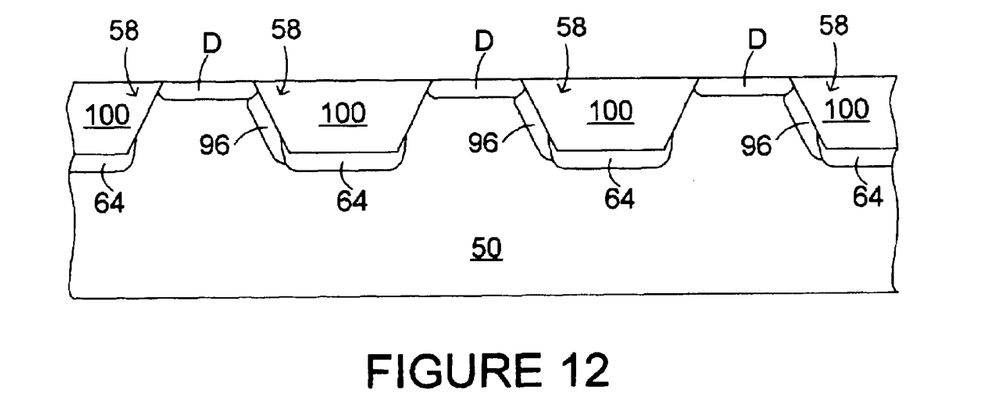
Figure 13:
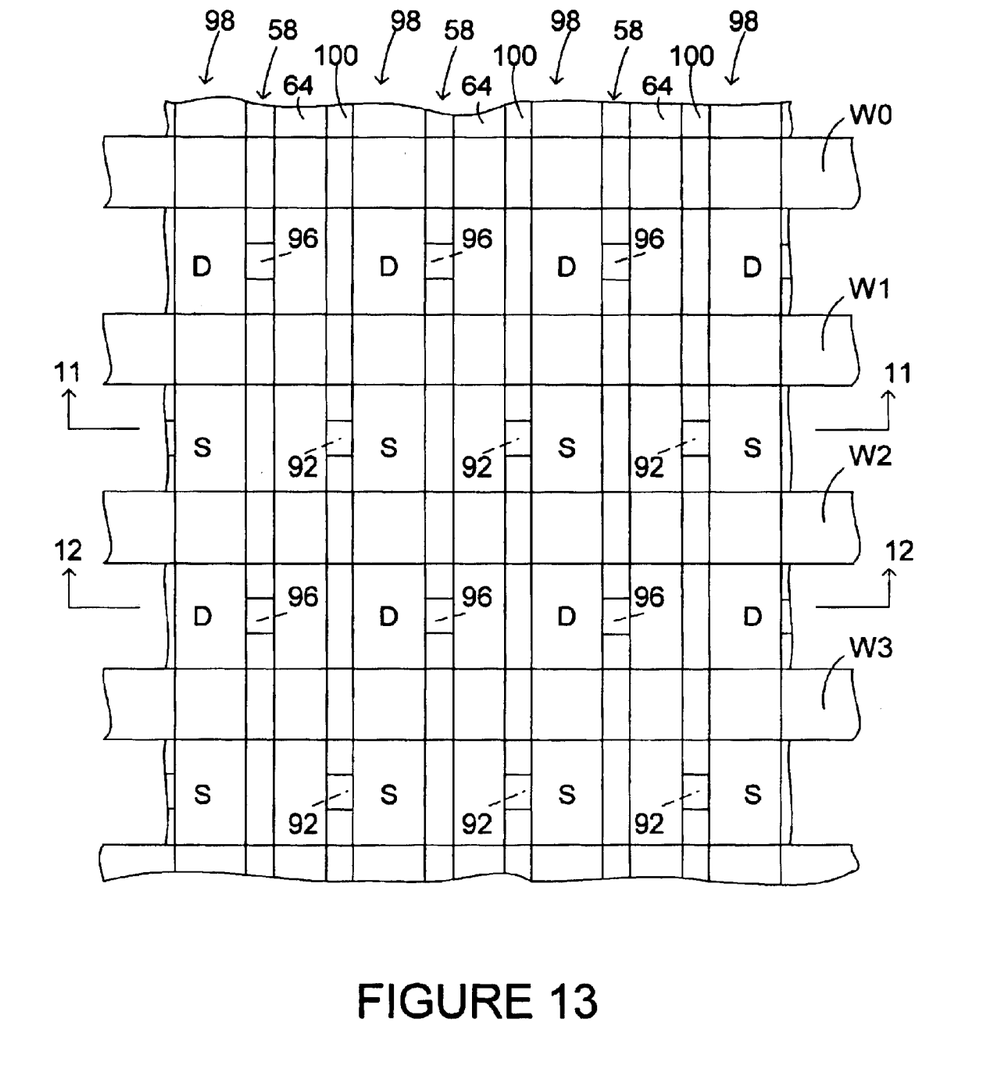
FIG. 13 is a view similar to that shown in FIG. 10, but showing the device further along in fabrication.

Upon appropriate masking, and with reference to FIG. 8, an implantation step 90 is undertaken at the top surfaces 50A of the silicon 70 straight 50 between the trenches 58 and at the respective walls 58B of the trenches 58 to form a plurality of spaced source regions S and a plurality of connecting conductive regions 92 in the substrate 50 that connect each conductive region 64 at the base 58A of a trench 58 with sources S on one side of that trench 58. Upon appropriate further masking, and with reference to FIG. 9, an implantation step 94 is undertaken at the top surfaces 50B of the silicon substrate 50 between the trenches 58 and between the spaced sources S. This implantation is also provided in the respective opposite walls 58C of the trenches 58 to form a plurality of spaced drains D and a plurality of connecting conductive regions 96 in the substrate 50 that connect each conductive region 64 at the base 58A of a trench 58 with the drains D on the other side of that trench 58. In this manner, elongated, substantially parallel source/drain regions 98 are formed in the substrate 50, each made up of a plurality of sources S and drains D alternating along its length. Then, the trenches 58 between the word lines W0, W1, W2, W3 are filled with oxide (FIGS. 11, 12 and 13) to provide elongated oxide regions 100 in the trenches 58, each oxide region 100 positioned between adjacent pairs of source/drain regions 98, so that each oxide region 100 has respective source/drain regions 98 on one and the other sides thereof.

As will be seen, respective oxide regions 100 overlie each bit line 64 lying at the base 58A of a trench 58. The connecting conductive regions 92 (at a wall 58B of a trench 58) extending from one side of each bit line 64 connect each bit line 64 with a plurality of sources S of a source/drain region 98 on one side of the oxide region 100 overlying that bit line 64. Furthermore, the connecting conductive regions 96 (at a wall 58C of a trench 58) extending from the other side of that bit line 64 connect that bit line 64 with a plurality of drains D of the source/drain region 98 on the other side of the oxide region 100 overlying that bit line 64.

The connecting conductive regions 92, 96 associated with each bit line for extend therefrom to the source/drain regions 98 on one and the other sides of the oxide region 100 overlying that bit line 64 in an alternating manner along the bit line 64 length.

It will be seen that the problems associated the array of FIGS. 1 and 2 above are overcome. In particular, vias need not be formed to make connector to the source/drain regions of the device, and the metallization layer forming the individual metal bit lines is avoided.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:

a substrate;

a plurality of source/drain regions in the substrate, each comprising a plurality of alternating sources and drains alternating along its length;

a plurality of insulating regions, each positioned between adjacent pairs of source/drain regions, so that each insulating region has respective source/drain regions on one and the other sides thereof;

a plurality of word lines;

a plurality of bit lines, each comprising a conductive region in the substrate, a respective insulating region overlying each bit line, a connecting conductive region formed in the substrate and connecting a bit line with a source/drain region on a side of the insulating region overlying that bit line.

2. The memory device of claim 1 and further comprising a plurality of connecting conductive regions formed in the substrate and connecting each bit line with a source/drain region on a side of the insulating layer overlying that bit line.

3. The memory device of claim 2 wherein the substrate defines a plurality of trenches, each insulating region being in a trench.

4. The memory device of claim 3 wherein the conductive region of each bit line is at the base of a trench.

5. The memory device of claim 4 wherein the connecting conductive regions connecting a bit line and a source/drain region are at a wall of a trench.

6. The memory device of claim 5 wherein the insulating regions are oxide regions.

7. The memory device of claim 6 wherein the plurality of the source/drain regions are elongated and substantially parallel.

8. A memory device comprising:

a substrate;

a plurality of source/drain regions in the substrate, each comprising a plurality of sources and drains alternating along its length;

a plurality of insulating regions, each positioned between adjacent pair of source/drain regions, so that each insulating region has respective source/drain regions on one and the other sides thereof;

a plurality of word lines;

a plurality of bit lines, each comprising a conductive region in the substrate, a respective insulating region overlying each bit line;

a plurality of connecting conductive regions in the substrate and associated with each bit line, each bit line being connected to (i) the sources of a source/drain region on one side of the insulating region overlying that bit line by some of the connecting conductive regions associated with that bit line, and (ii) the drains of source/drain region on the other side of the insulating region overlying that bit line by others of the connecting conductive regions associated with that bit line.

9. The memory devices claim 8 wherein the connecting conductive regions associated with each bit line extend therefrom to the source/drain regions on one and the other sides of the insulating region overlying that bit line in an alternating manner along the bit line length.

10. The memory device claim 9 wherein the substrate defines a plurality of trenches, each insulating region being in a trench.

11. The memory device of claim 10 wherein the conductive region of each bit line is at the base of a trench.

12. The memory device of claim 11 wherein the connecting conductive regions associated with each bit line are at the walls of a trench.

13. The memory device of claim 12 wherein the insulating regions are oxide regions.

* * * * *